(12) United States Patent
Wang et al.

(10) Patent No.: US 11,031,486 B2
(45) Date of Patent: Jun. 8, 2021

(54) SEMICONDUCTOR DEVICE AND METHODS OF MANUFACTURE

(71) Applicant: Taiwan Semiconductor Manufacturing Company, Ltd., Hsinchu (TW)

(72) Inventors: Yu-Sheng Wang, Tainan (TW); Chi-Cheng Hung, Tainan (TW); Chia-Ching Lee, New Taipei (TW); Ching-Hwanq Su, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/690,455

(22) Filed: Nov. 21, 2019

(65) Prior Publication Data

US 2020/0091315 A1    Mar. 19, 2020

Related U.S. Application Data

(60) Continuation of application No. 16/050,741, filed on Jul. 31, 2018, now Pat. No. 10,516,034, which is a
(Continued)

(51) Int. Cl.
| *H01L 27/092* | (2006.01) |
| *H01L 29/66* | (2006.01) |
| *H01L 29/49* | (2006.01) |
| *H01L 29/78* | (2006.01) |
| *H01L 21/28* | (2006.01) |

(Continued)

(52) U.S. Cl.
CPC .. *H01L 29/66545* (2013.01); *H01L 21/28088* (2013.01); *H01L 21/76224* (2013.01); *H01L 29/0653* (2013.01); *H01L 29/0847* (2013.01); *H01L 29/4958* (2013.01); *H01L 29/4966* (2013.01); *H01L 29/517* (2013.01); *H01L 29/66636* (2013.01); *H01L 29/66795* (2013.01); *H01L 29/785* (2013.01); *H01L 29/7851* (2013.01); *H01L 29/518* (2013.01)

(58) Field of Classification Search
None
See application file for complete search history.

(56) References Cited

U.S. PATENT DOCUMENTS

| 7,541,269 B2 | 6/2009 | Kim et al. |
| 8,487,378 B2 | 7/2013 | Goto et al. |

(Continued)

FOREIGN PATENT DOCUMENTS

| CN | 101154576 A | 4/2008 |
| CN | 105405764 A | 3/2016 |

(Continued)

*Primary Examiner* — Joseph C. Nicely
*Assistant Examiner* — Lamont B Koo
(74) *Attorney, Agent, or Firm* — Slater Matsil, LLP (57) ABSTRACT

A semiconductor device and method of manufacturing are provided. In an embodiment a first nucleation layer is formed within an opening for a gate-last process. The first nucleation layer is treated in order to remove undesired oxygen by exposing the first nucleation layer to a precursor that reacts with the oxygen to form a gas. A second nucleation layer is then formed, and a remainder of the opening is filled with a bulk conductive material.

18 Claims, 10 Drawing Sheets

Related U.S. Application Data division of application No. 15/433,121, filed on Feb. 15, 2017, now Pat. No. 10,522,650.

(60) Provisional application No. 62/427,511, filed on Nov. 29, 2016.

(51) Int. Cl.
*H01L 21/762* (2006.01)
*H01L 29/06* (2006.01)
*H01L 29/08* (2006.01)
*H01L 29/51* (2006.01)

(56) References Cited

U.S. PATENT DOCUMENTS

| | | | |
|---|---|---|---|
| 8,729,634 | B2 | 5/2014 | Shen et al. |
| 8,826,213 | B1 | 9/2014 | Ho et al. |
| 8,887,106 | B2 | 11/2014 | Ho et al. |
| 2002/0190379 | A1 | 12/2002 | Jian et al. |
| 2003/0153181 | A1* | 8/2003 | Yoon ............... C23C 16/0281 438/685 |
| 2006/0110900 | A1 | 5/2006 | Youn et al. |
| 2011/0147831 | A1 | 6/2011 | Steigerwald et al. |
| 2011/0298062 | A1 | 12/2011 | Ganguli et al. |
| 2013/0109172 | A1* | 5/2013 | Collins ............. H01L 21/76864 438/653 |
| 2014/0282326 | A1 | 9/2014 | Chen et al. |
| 2015/0214226 | A1* | 7/2015 | Su ....................... H01L 27/0886 257/401 |
| 2015/0228491 | A1 | 8/2015 | Kang |
| 2015/0228793 | A1 | 8/2015 | Chen et al. |
| 2015/0325669 | A1 | 11/2015 | Zhu et al. |
| 2016/0133632 | A1 | 5/2016 | Park et al. |
| 2016/0181163 | A1 | 6/2016 | Huang et al. |
| 2016/0190305 | A1 | 6/2016 | JangJian et al. |
| 2017/0110375 | A1 | 4/2017 | Bao et al. |
| 2017/0125408 | A1 | 5/2017 | Park et al. |
| 2017/0125548 | A1 | 5/2017 | Hung et al. |

FOREIGN PATENT DOCUMENTS

| | | |
|---|---|---|
| CN | 105514024 A | 4/2016 |
| JP | 2000223441 A | 8/2000 |
| KR | 20080061978 A | 7/2008 |
| KR | 20150093384 A | 8/2015 |
| KR | 20150093583 A | 8/2015 |

* cited by examiner

SEMICONDUCTOR DEVICE AND METHODS OF MANUFACTURE

PRIORITY CLAIM

This application is a continuation of application Ser. No. 16/050,741, filed on Jul. 31, 2018, which is a divisional of application Ser. No. 15/433,121, filed on Feb. 15, 2017, which claims the benefit of U.S. Provisional Application No. 62/427,511, filed on Nov. 29, 2016 and entitled "Semiconductor Device and Methods of Manufacture," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
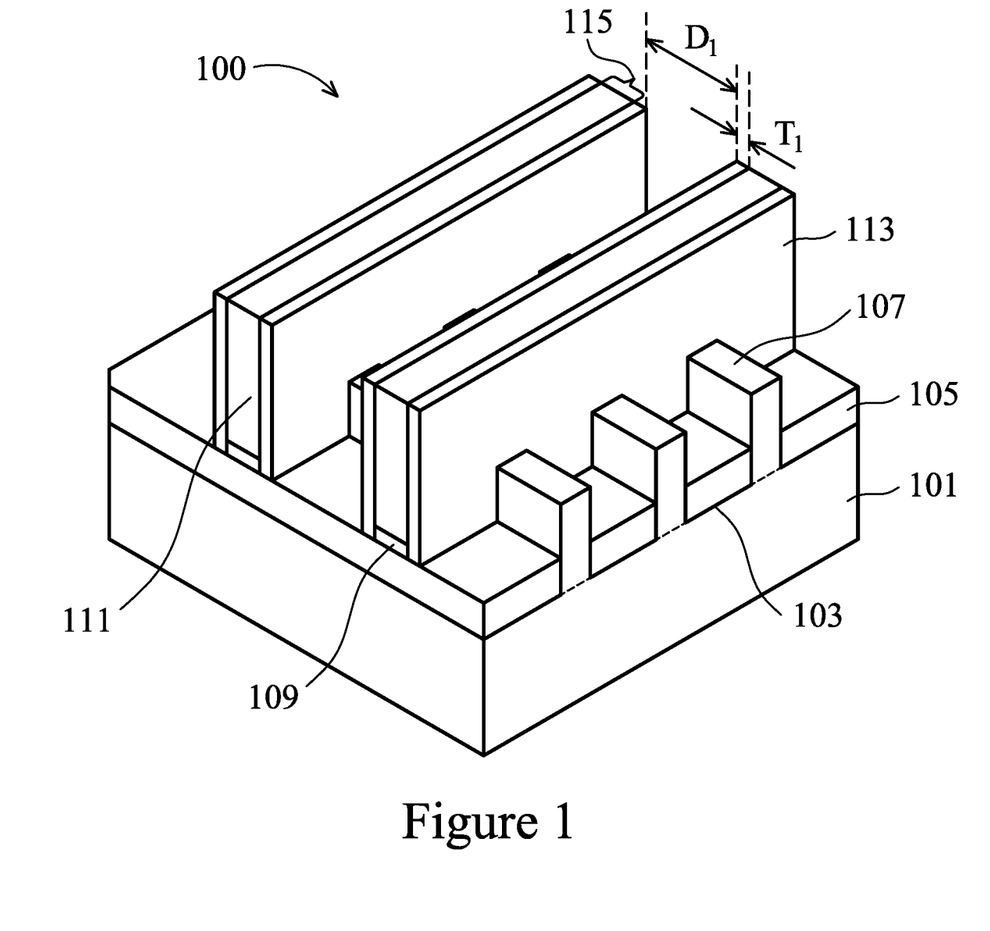
FIG. 1 illustrates steps in a process of forming a finFET device in accordance with some embodiments.

With reference now to FIG. 1, there is illustrated a perspective view of a semiconductor device 100 such as a finFET device. In an embodiment the semiconductor device 100 may be a semiconductor device for a 10 nm process node and comprises a substrate 101 with first trenches 103 formed therein. The substrate 101 may be a silicon substrate, although other substrates, such as semiconductor-on-insulator (SOI), strained SOI, and silicon germanium on insulator could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å or 43.17 nm.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å. Additionally, once the first spacers 113 have been formed, a first spacer 113 adjacent to one stack 115 may be separated from a first spacer 113 adjacent to another stack 115 by a first distance $D_1$ of between about 5 nm and about 200 nm, such as about 20 nm. However, any suitable thicknesses and distances may be utilized.

Figure 2:
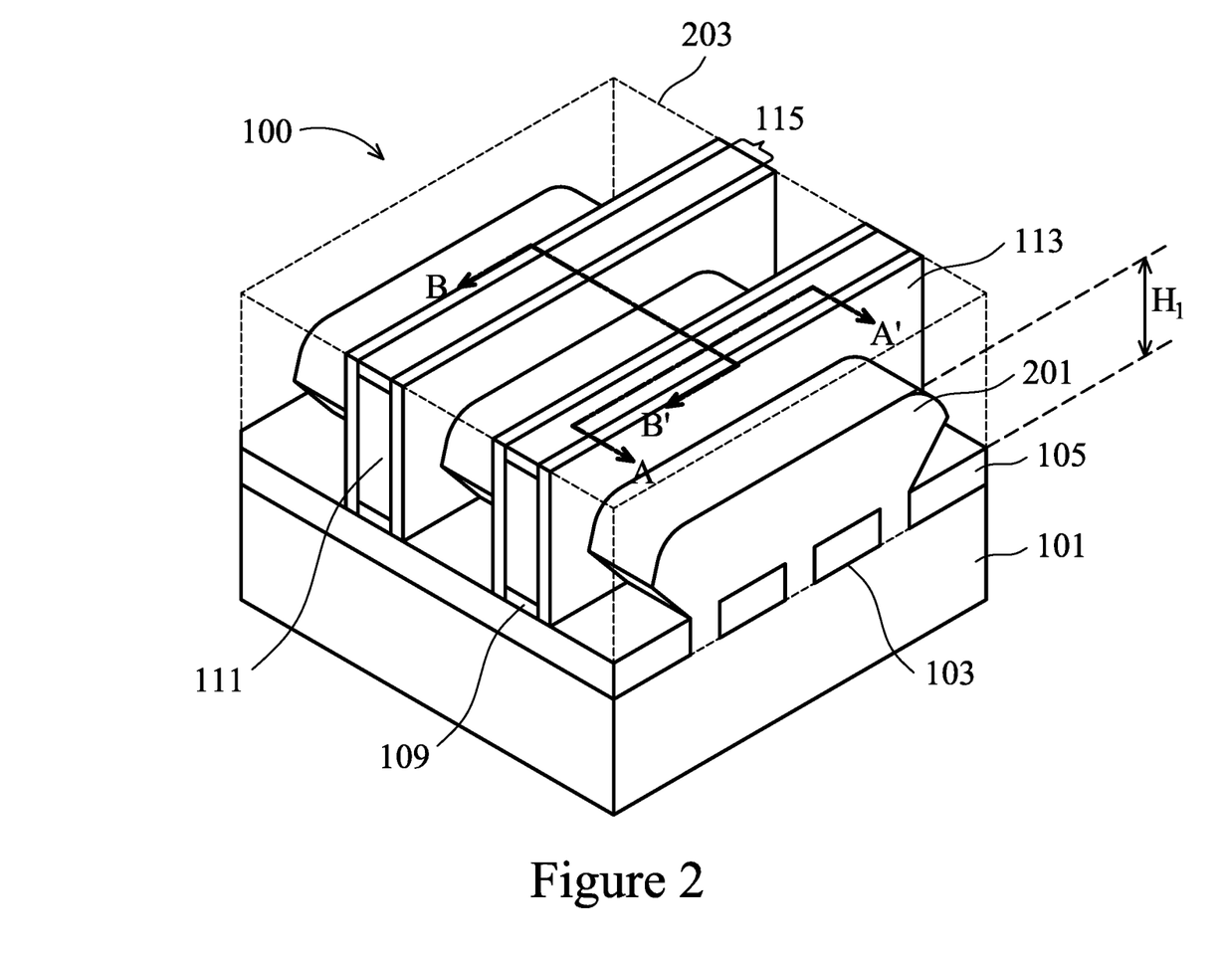
FIG. 2 illustrates formation of source/drain regions in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a first height $H_1$ over the first isolation regions 105 of between about 10 Å and about 500 Å, such as about 200 Å. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present disclosure to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3A:
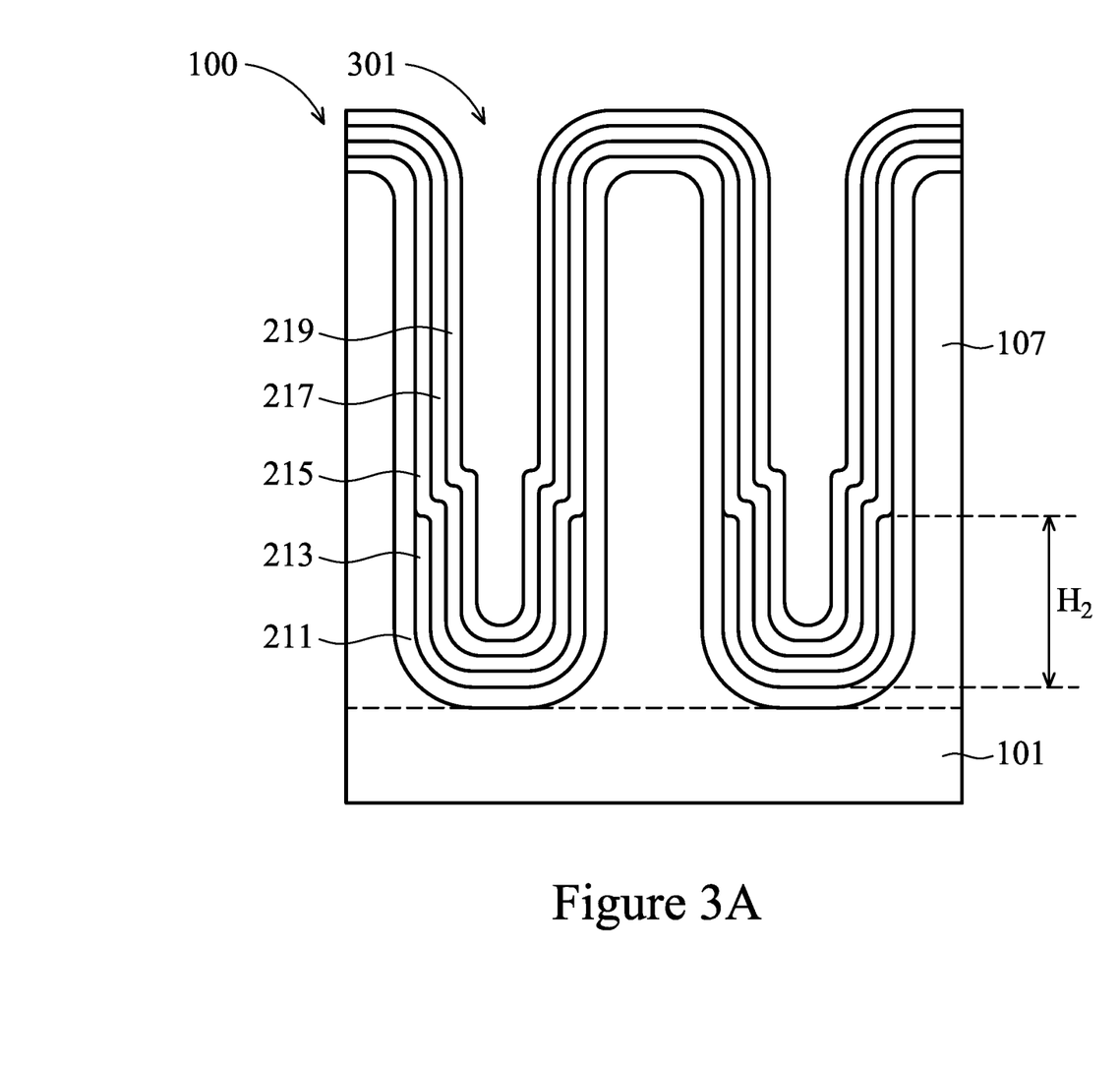
FIGS. 3A-3B illustrate a formation of a first nucleation layer in accordance with some embodiments.
Figure 3B:
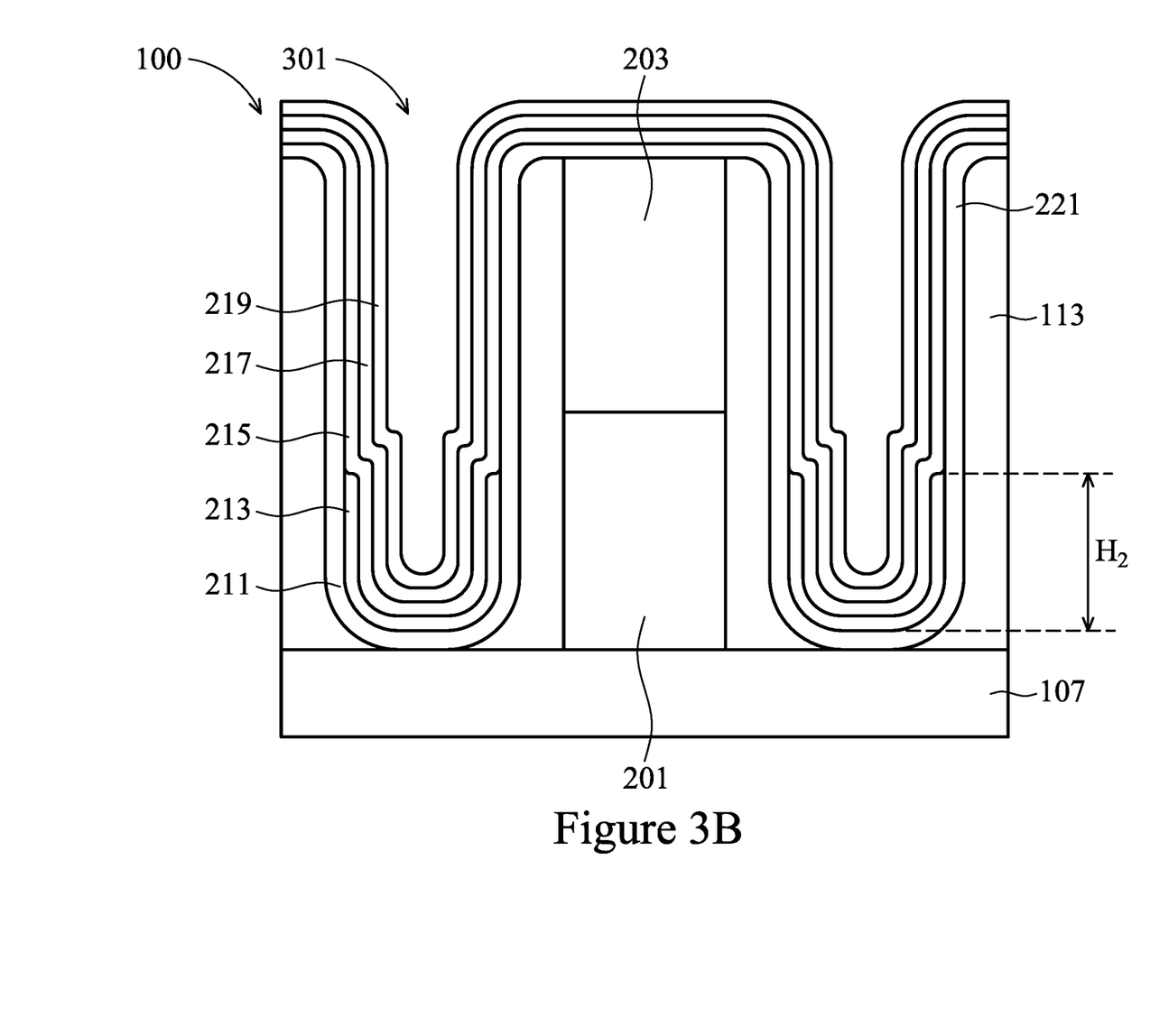

FIGS. 3A-3B illustrate that, after the formation of the ILD layer 203, the material of the dummy gate electrode 111 and the dummy gate dielectric 109 may be removed and replaced to form a gate stack 601 (not illustrated in FIGS. 3A-3B but illustrated in FIGS. 6A-6B below), with FIG. 3A illustrating a cross-sectional view of FIG. 2 along line A-A' and FIG. 3B illustrating a cross-sectional view of FIG. 2 along line B-B' (with subsequent figures illustrating similar views based on the lettering of the figure). In an embodiment the dummy gate electrode 111 and the dummy gate dielectric 109 may be removed using, e.g., one or more wet or dry etching process that utilizes etchants that are selective to the material of the dummy gate electrode 111 and the dummy gate dielectric 109. However, any suitable removal process may be utilized.

The opening 301 formed by the removal of the dummy gate electrode 111 and the dummy gate dielectric 109 may be formed to have a high aspect ratio. For example, in some embodiments the opening 301 will have an aspect ratio of the gate height versus the critical dimension that may be greater than about 6. However, any suitable aspect ratio may be utilized.

Once the dummy gate electrode 111 and the dummy gate dielectric 109 have been removed, the openings left behind may be refilled to form the gate stack 601. In a particular embodiment the formation of the gate stack 601 may be started by forming a first dielectric material 211, a first metal comprising material 213, a second metal comprising material 215, a blocking material 217, and a first nucleation layer 219. In an embodiment the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 211 may be deposited to a thickness of between about 5 Å and about 200 Å, although any suitable material and thickness may be utilized.

The first metal comprising material 213 may be formed adjacent to the first dielectric material 211 and may be formed from a metallic material such as titanium nitride doped with silicon (TSN), although other suitable materials, such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like, may also be utilized. In an embodiment in which the first metal comprising material 213 is TSN, the first metal comprising material 213 may be deposited using a deposition process such as atomic layer deposition, although other suitable processes, such as chemical vapor deposition, sputtering, or the like may also be used. The first metal comprising material 213 may be deposited to a thickness of between about 5 Å and about 200 Å, although any suitable thickness may be used.

Once the first metal comprising material 213 has been formed the first metal comprising material 213 may be etched back. In an embodiment the first metal comprising material 213 may be etched using, e.g., an anisotropic etching process, such as a reactive ion etch, which recesses the first metal comprising material 213 to a level below the first spacers 113. For example, the etching process may be performed until the first metal comprising material 213 has a second height $H_2$ of between about 40 nm and about 80 nm, such as about 60 nm. However, any suitable height may be utilized.

Once the first metal comprising material 213 has been formed (and, optionally, etched back), the second metal comprising material 215 may be formed adjacent to the first metal comprising material 213. In an embodiment, the second metal comprising material 215 may be formed from a work function metal such as TiAl, Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal comprising material 215 may be deposited using a deposition process such as atomic layer deposition, chemical vapor deposition, sputtering, or the like, to a thickness of between about 5 Å and about 200 Å, although any suitable deposition process or thickness may be used.

In another embodiment the second metal comprising material 215, instead of being a single layer of a single material, may be a composite layer of a first one of the materials for the second metal comprising material 215 (e.g., TiAl) and a second one of the materials for the second metal comprising material 215 (e.g., titanium nitride). In an embodiment in which the first one of the materials for the second metal comprising material 215 is TiAl and the second one of the materials for the second metal comprising material 215 is titanium nitride, the layer of TiAl may be deposited to a thickness of between about 20 Å and about 30 Å, such as about 25 Å, and the layer of titanium nitride may be deposited to a thickness of between about 5 Å and about 15 Å, such as about 10 Å. However, any suitable materials and thicknesses may be utilized.

The blocking material 217 may be used to block the movement of materials from the third metal comprising material 503 to other regions. In an embodiment the blocking material 217 may be a material such as titanium nitride, although any other suitable material, such as TaN or WN may be used. The blocking material 217 may be deposited using a process such as atomic layer deposition, chemical vapor deposition, sputtering, or the like, to a thickness of between about 5 Å and about 25 Å, such as 15 Å, although any suitable deposition process or thickness may be used.

After the blocking material has been deposited, the first nucleation layer 219 is formed in order to allow for a first nucleation of the third metal comprising material 503. Additionally, in an embodiment the first nucleation layer 219 is formed as a fluorine free material in order to help prevent the movement of fluorine into other portions of the structure. In a particular embodiment in which the third metal comprising material 503 is tungsten, the first nucleation layer 219 may be a material such as fluorine free tungsten (FFW) deposited to a thickness of between about 10 Å and about 50 Å, such as about 30 Å.

In an embodiment in which the first nucleation layer 219 is fluorine free tungsten, the first nucleation layer 219 may be formed using a chemical vapor deposition process, whereby a tungsten comprising precursor such as $W(CO)_6$ is introduced under appropriate conditions to cause the $W(CO)_6$ to decompose into a layer of tungsten and carbon dioxide. For example, the deposition may be performed at a temperature of between about 200° C. and about 450° C. and at a pressure of less than about 2 Torr, although any suitable process conditions may be utilized.

However, while the first nucleation layer 219 is formed under non-atmospheric conditions, after the formation of the first nucleation layer 219 the first nucleation layer 219 may be removed from the deposition chamber and exposed to external atmosphere. In such a breaking of the vacuum, the oxygen within the air may enter into the outer layers of the first nucleation layer 219 and form an oxide such as tungsten oxide ($WO_x$). Such an introduction of oxygen into the first nucleation layer 219 can interfere with subsequent depositions (e.g., the deposition of the third metal comprising material 503), thereby preventing the subsequent depositions from completely filling the opening, causing undesired voids (e.g., gaps within the material in which no solid material may be located and which may either be a vacuum or filled with a gaseous material such as ambient air) to be formed within the gate stack 601.

Figure 4A:
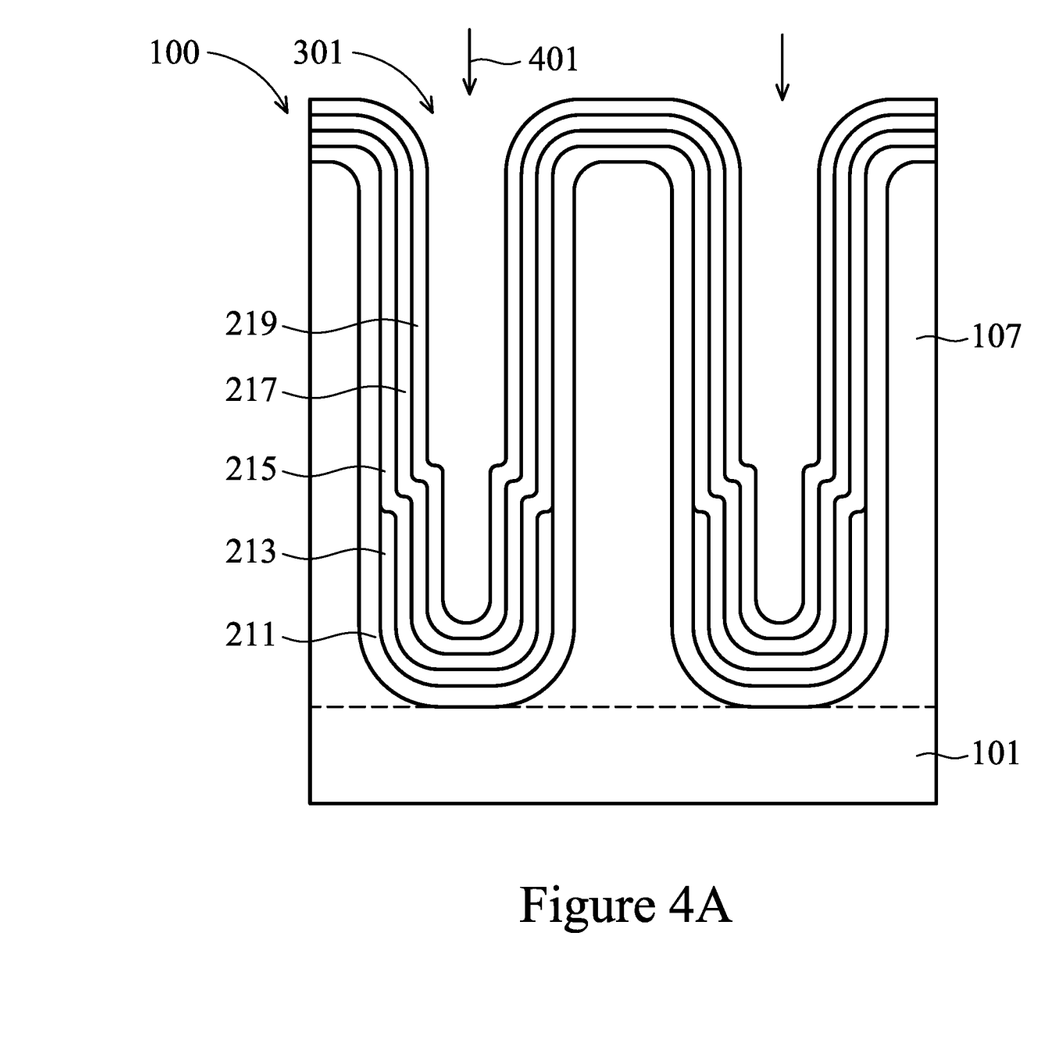
FIGS. 4A-4B illustrate a treatment of the first nucleation layer in accordance with some embodiments.
Figure 4B:
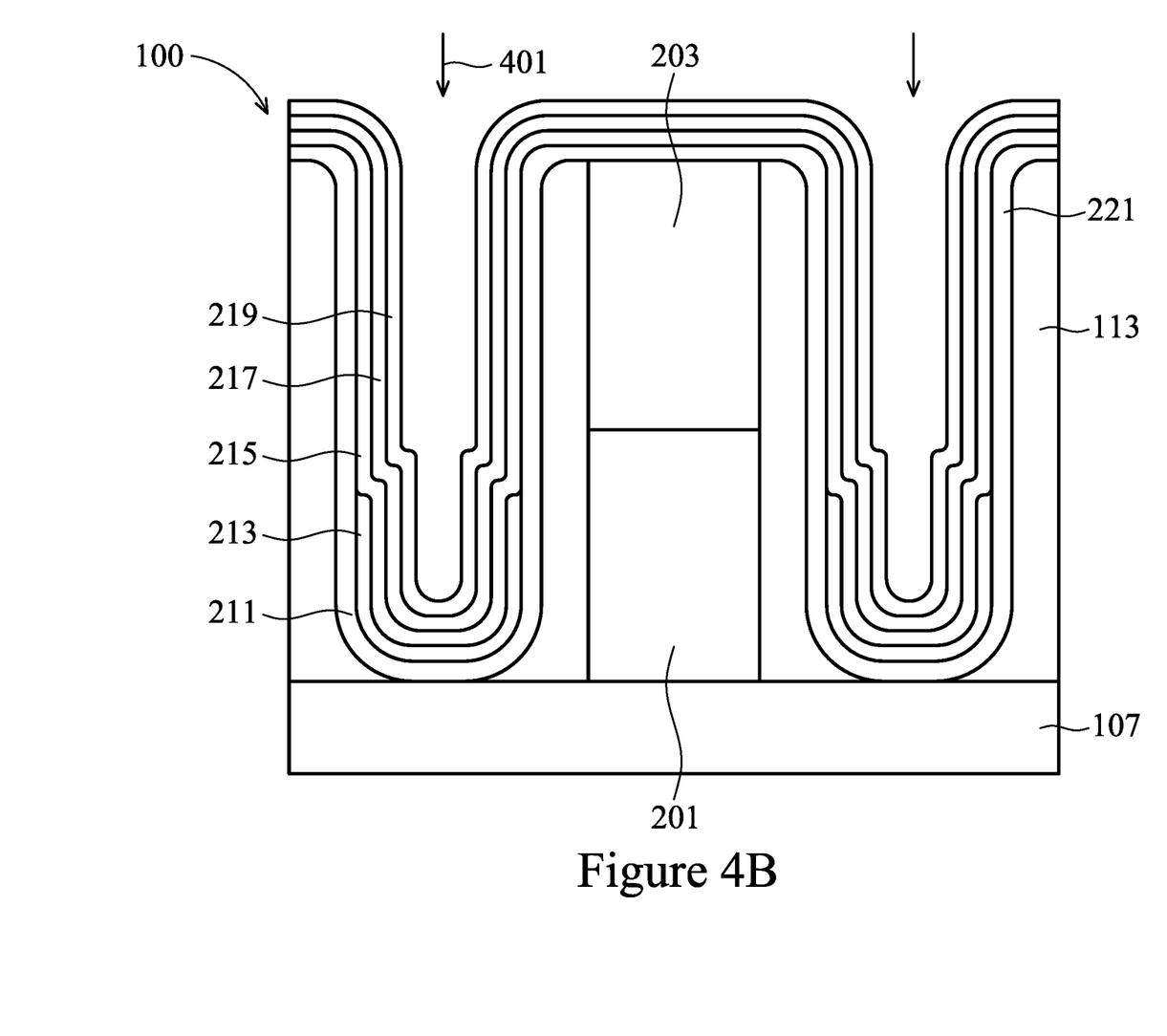

FIGS. 4A-4B illustrate that, in an embodiment which may be used to help prevent the occurrence of voids, a pre-soak step (represented in FIGS. 4A-4B by the arrows labeled 401) is performed after the formation of the first nucleation layer 219 in order to remove the oxygen from the exposed portions of the first nucleation layer 219. In an embodiment the pre-soak is performed by exposing the first nucleation layer 219 to a pre-soak precursor that can react with the oxygen located within the first nucleation layer 219 (e.g., $WO_x$ in a solid form) and convert it into a gaseous form for removal. In a particular embodiment, the pre-soak precursor may be a gas such as $WF_6$, although any suitable precursor that can react with oxygen, such as $B_2H_6$, may be used.

In an embodiment the pre-soak precursor may be introduced to the first nucleation layer 219 at a flow rate of between about 50 sccm and about 250 sccm, such as about 150 sccm. Additionally, the pre-soak precursor may react with the oxygen at a temperature of between about 250° C. and about 350° C., such as about 300° C., and at a pressure of between about 25 torr and about 35 torr, such as about 30 torr. The pre-soak may continue for a time of between about 20 s and about 40 s, such as about 30 s. However, any suitable process conditions may be utilized.

By introducing the pre-soak precursor to the first nucleation layer 219, the pre-soak precursor will react with the oxygen present in the first nucleation layer 219 such that the oxygen will react away from a solid form and into a gaseous form. For example, in an embodiment in which the first nucleation layer 219 is tungsten (and, as such, has oxygen in the form $WO_x(s)$), and the pre-soak precursor is $WF_6(g)$, the $WF_6(g)$ will react with the oxygen in the solid form ($WO_x(s)$) and form the gaseous $WOF_4$, according to the following equation:

$$WO_x(s) + WF_6(g) \rightarrow WOF_4(g)$$

With the oxygen now in a gaseous form, the oxygen will be removed from the first nucleation layer 219. In a particular embodiment, the pre-soak removes oxygen until the oxygen at the exposed surface is less than about 0.1%-atomic, although there may still be some residual oxygen at a concentration greater than zero. However, any suitable reduction of the concentration of oxygen may be utilized.

Figure 5A:
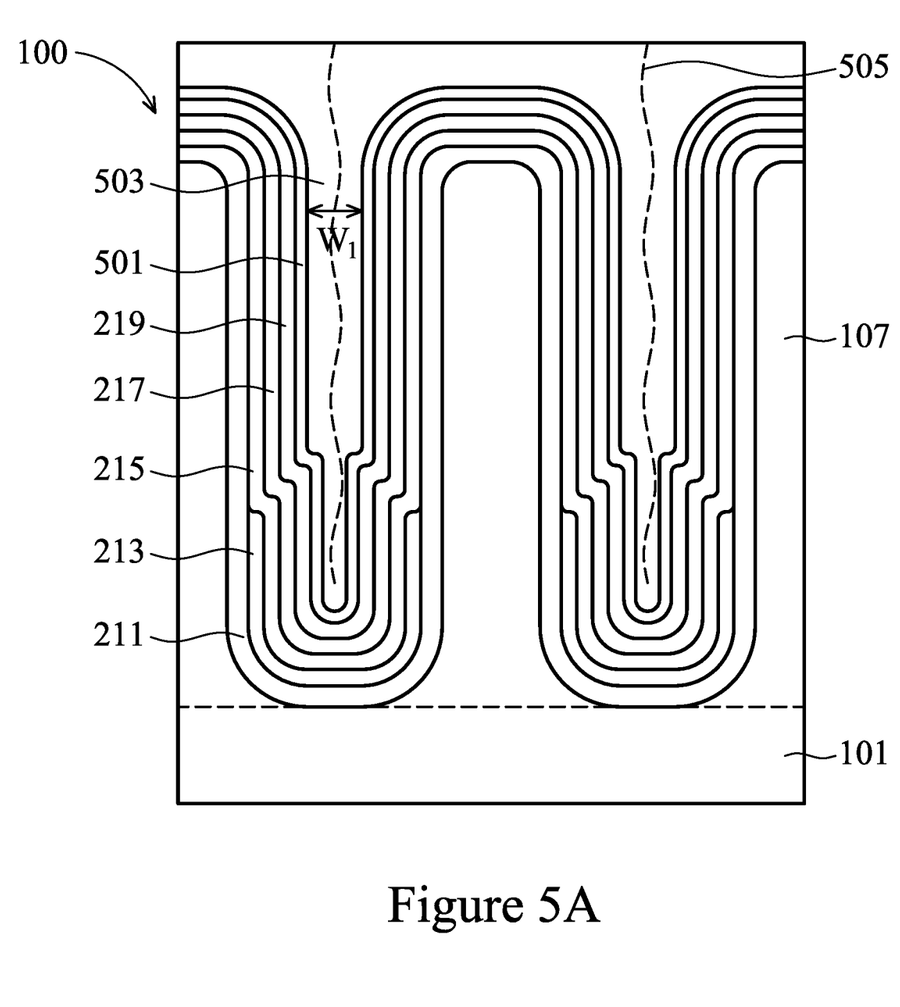
FIGS. 5A-5B illustrate a formation of a second nucleation layer and a bulk material in accordance with some embodiments.
Figure 5B:
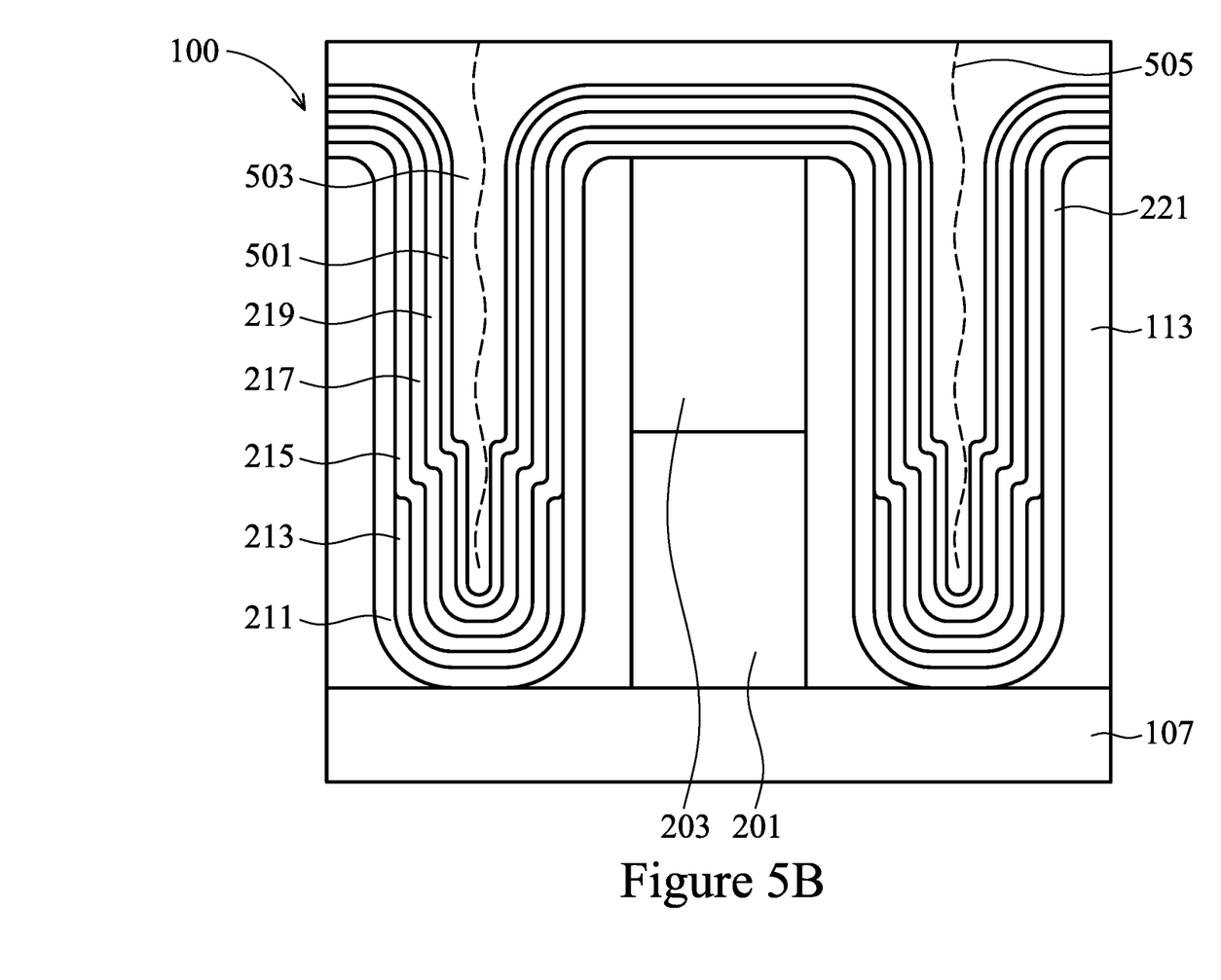

FIGS. 5A-5B illustrate that, after the pre-soak has been performed to remove the oxygen from the first nucleation layer 219, a second nucleation layer 501 and a third metal comprising material 503 are formed over the first nucleation layer 219. In an embodiment the second nucleation layer 501 may be formed using, e.g., a chemical vapor deposition process with precursors such as $WF_6$ and $SiH_4$ along with a carrier gas such as nitrogen. In such an embodiment the $WF_6$ may be introduced at a flow rate of between about 20 sccm and about 100 sccm, such as about 60 sccm, while the $SiH_4$ may be introduced at a flow rate of between about 200 sccm and about 600 sccm, such as about 400 sccm. Additionally, the deposition process may be performed at a temperature of between about 250° C. and about 350° C., such as about 300° C., and at a pressure of between about 1 torr and about 2 torr, such as about 1.5 torr. The second nucleation layer 501 may be formed to a thickness of between about 1 nm and about 5 nm, such as about 3 nm. However, any other suitable deposition process such as ALD and any other suitable process parameters or thicknesses may be utilized.

However, with the use of $WF_6$ as one of the precursors to form the second nucleation layer 501, some residual fluorine may be present within the material of the second nucleation layer 501 at a higher level than the material of the first nucleation layer 219. For example, fluorine may be present within the material of the second nucleation layer 501 in a concentration of between about 1% and about 4%, such as about 2.5%. However, in embodiments in which the first nucleation layer 219 is a fluorine-free material, the first nucleation layer 219 will work to prevent the movement of fluorine from the second nucleation layer 501.

The third metal comprising material 503 fills a remainder of the opening left behind by the removal of the dummy gate electrode 111. In an embodiment the third metal comprising material 503 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as chemical vapor deposition, although any suitable process, such as atomic layer deposition, sputtering, or the like, may be used to fill and/or overfill the opening left behind by the removal of the dummy gate electrode 111 and may form a seam 505 as opposing sides of the third metal comprising material 503 come together from opposing sidewalls. In a particular embodiment the third metal comprising material 503 may be deposited to a thickness of between about 5 Å and about 500 Å, although any suitable material, deposition process, and thickness may be utilized and the third metal comprising material 503 may have a first width $W_1$ within the opening 301 of between about 5 nm and about 10 nm, such as about 8.35 nm.

In a particular embodiment, the third metal comprising material 503 may be formed using a chemical vapor deposition process with precursors such as $WF_6$ and $H_2$. The deposition process may be performed at a temperature of between about 250° C. and about 350° C., such as about 300° C. and at a pressure of between about 250 torr and about 350 torr, such as about 300 torr. However, any suitable process conditions may be utilized.

By removing the oxygen from the first nucleation layer 219, the interference of the oxygen may be reduced or eliminated. As such, during the filling of the opening 301, the opening 301 may be filled without voids being formed within the gate stack 601. Accordingly, operational and physical problems that arise from the presence of voids may be avoided, and the overall manufacturing and operational efficiencies may be improved.

Figure 6A:
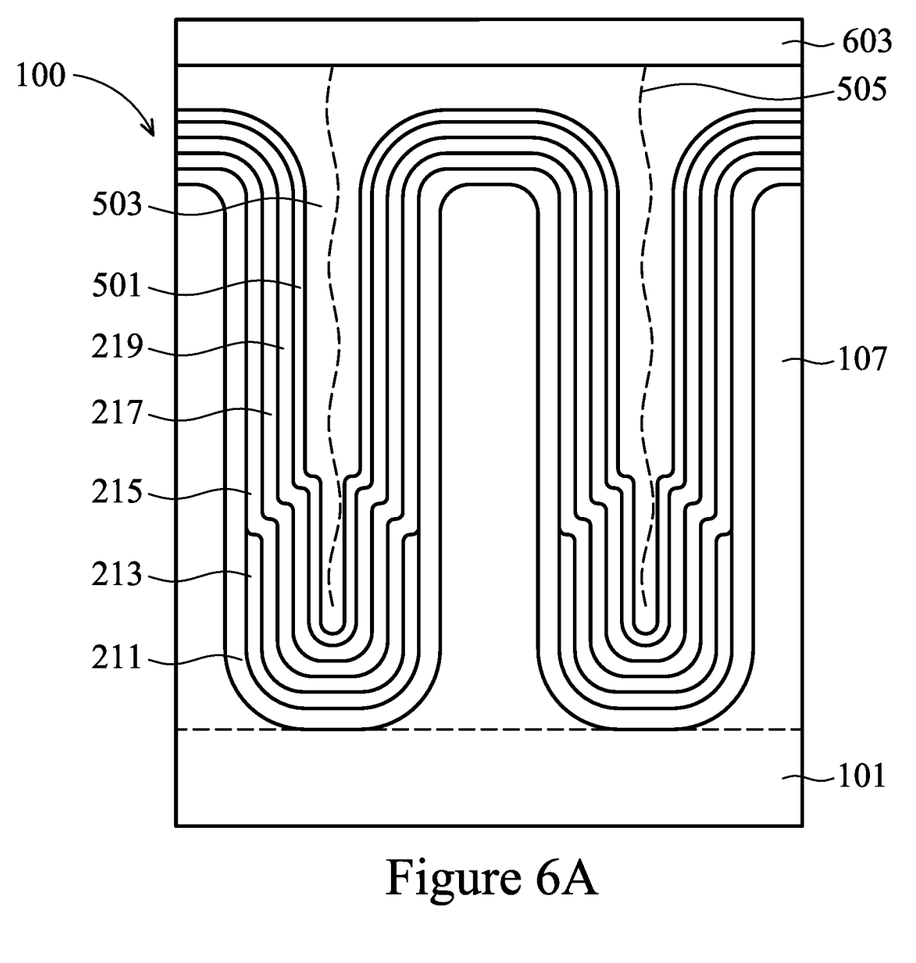
FIGS. 6A-6B illustrate a planarization and a capping process in accordance with some embodiments.
Figure 6B:
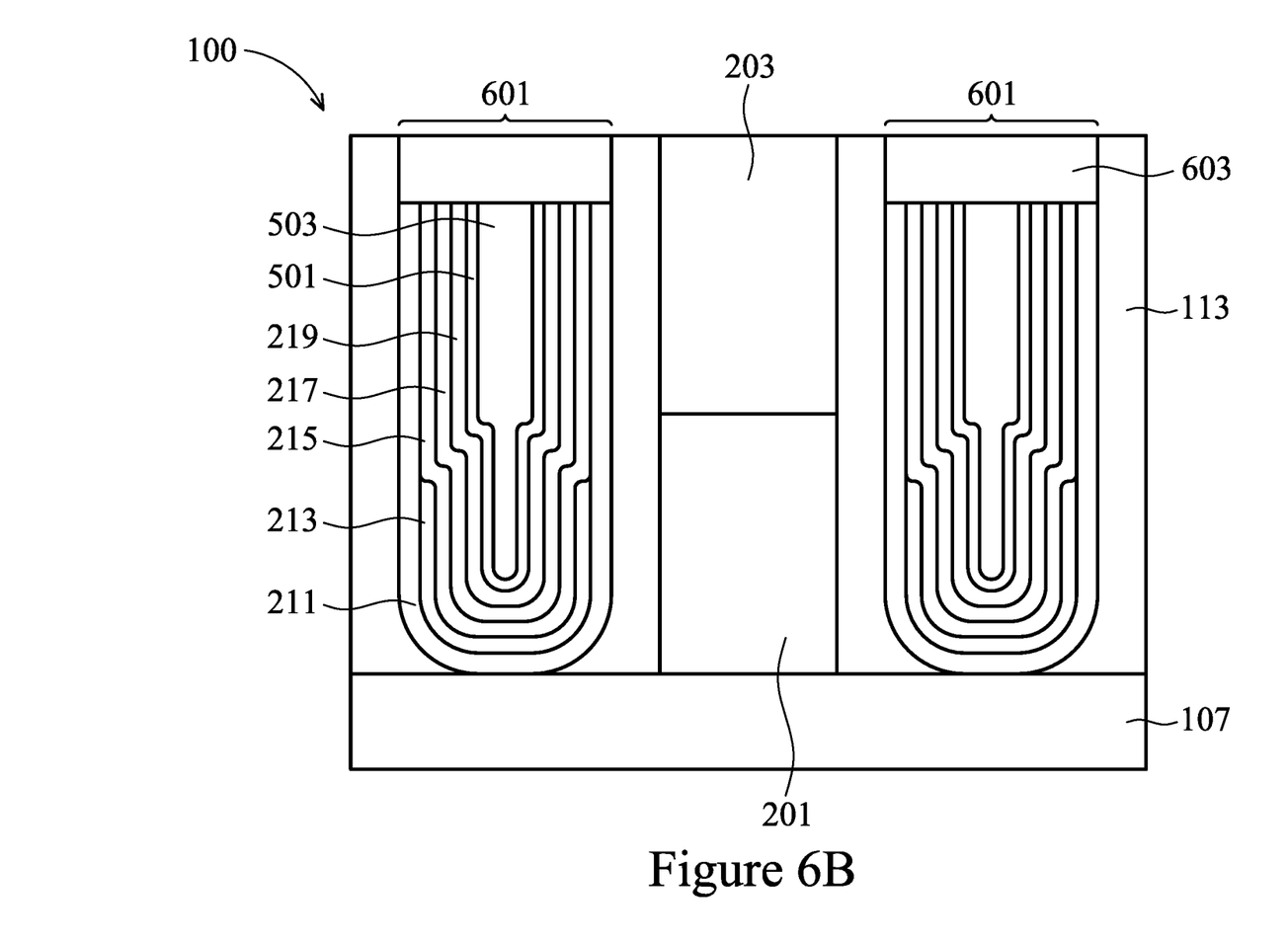

FIGS. 6A-6B illustrate that, once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

FIGS. 6A-6B also illustrate that, after the materials of the gate stack 601 have been formed and planarized, the materials of the gate stack 601 may be recessed and capped with a capping layer 603. In an embodiment the materials of the gate stack 601 may be recessed using, e.g., a wet or dry etching process that utilizes etchants selective to the materials of the gate stack 601. In an embodiment the materials of the gate stack 601 may be recessed a distance of between about 20 nm and about 35 nm, such as about 26 nm. However, any suitable process and distance may be utilized.

Once the materials of the gate stack 601 have been recessed, the capping layer 603 may be deposited and planarized with the first spacers 113. In an embodiment the capping layer 603 is a material such as SiN, SiON, SiCON, SiC, SiOC, combinations of these, or the like, deposited using a deposition process such as atomic layer deposition, chemical vapor deposition, sputtering, or the like. The capping layer 603 may be deposited to a thickness of between about 5 Å and about 200 Å, and then planarized using a planarization process such as chemical mechanical polishing such that the capping layer 603 is planar with the first spacers 113.

Once the gate stack 601 has been formed, additional manufacturing may be performed. For example, contacts (not illustrated in FIGS. 6A-6B) to both the gate stack 601 (through the capping layer 603) and the source/drain region 201 (through the ILD layer 203) may be manufactured. Additionally, metallization layers (not illustrated in FIGS. 6A-6B) may be manufactured over the gate stack 601 in order to interconnect the gate stacks 601 to other devices in order to form a functional device. Any suitable additional manufacturing steps may be utilized.

In accordance with an embodiment, a method of manufacturing a semiconductor device the method comprising forming a dummy gate stack over a semiconductor substrate and removing the dummy gate stack from over the semiconductor substrate to form a first opening and depositing a gate dielectric within the first opening is provided. A first nucleation layer is deposited within the first opening and over the gate dielectric, the first nucleation layer is treated to remove oxygen, and a conductive material is deposited to fill a remainder of the first opening.

In accordance with another embodiment, a method of manufacturing a semiconductor device comprising removing a dummy gate electrode material to form an opening in a dielectric material over a substrate and depositing a first metal comprising material into the opening is provided. A second metal comprising material is deposited into the opening, the second metal comprising material being different from the first metal comprising material. A first blocking material is deposited onto the second metal comprising material, and a first nucleation layer is deposited onto the first blocking material. Oxygen is removed from a surface of the first nucleation layer such that the oxygen is reduced to a concentration below 0.1%-atomic, and a second nucleation layer is deposited in physical contact with the first nucleation layer. A remainder of the opening is filled with a conductive material.

In accordance with yet another embodiment, a semiconductor device comprising a first dielectric material over a substrate, wherein opposing sidewalls of an exterior surface of the first dielectric material have an aspect ratio of greater than 6 is provided. A first conductive material is adjacent to the first dielectric material, the first conductive material comprising a first metal, and a second conductive material is adjacent to the first conductive material, the second conductive material being different from the first conductive material. A blocking material is adjacent to the second conductive material and a first nucleation layer is adjacent to the blocking material. A second nucleation layer is adjacent to the first nucleation layer, wherein the first nucleation layer has an oxygen concentration greater than zero but less than 0.1% atomic adjacent to a boundary between the first nucleation layer and the second nucleation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    depositing a first dielectric material in an opening over a substrate;
    depositing a first conductive material over the first dielectric material, the first conductive material comprising a first metal;
    depositing a second conductive material over the first conductive material, the second conductive material being different from the first conductive material;
    depositing a blocking material over the second conductive material;
    depositing a first nucleation layer over the blocking material;
    depositing a second nucleation layer over the first nucleation layer, wherein the first nucleation layer has an oxygen concentration greater than zero but less than 0.1% atomic adjacent to a boundary between the first nucleation layer and the second nucleation layer; and
    exposing the first nucleation layer to oxygen prior to depositing the second nucleation layer.

2. The method of claim 1 further comprising filling a remainder of the opening with a fill material after depositing the second nucleation layer.

3. The method of claim 2, wherein the fill material is free from gaps filled with vacuum.

4. The method of claim 2, wherein the fill material is free from gaps filled with air.

5. The method of claim 1, where depositing the first nucleation layer comprises using $W(CO)_6$ as a precursor, and wherein depositing the second nucleation layer comprises using $WF_6$ as a precursor.

6. The method of claim 1, wherein the opening has an aspect ratio greater than six prior to depositing the first dielectric material.

7. The method of claim 1, wherein depositing the second conductive material comprises depositing a first conductive layer over a second conductive layer, the first conductive layer and the second conductive layer have different material compositions.

8. The method of claim 1 further comprising performing a pre-soak on the first nucleation layer prior to depositing the second nucleation layer, wherein the pre-soak removes oxygen from the first nucleation layer.

9. The method of claim 8, wherein performing the pre-soak comprises flowing $WF_6$ or $B_2H_6$ in gaseous form over the first nucleation layer.

10. A semiconductor device comprising:
    a semiconductor fin;
    a gate stack over and along sidewalls of the semiconductor fin, wherein the gate stack comprises:
        a high-k dielectric;
        a first nucleation layer over the high-k dielectric; and
        a second nucleation layer over the first nucleation layer, wherein an oxygen concentration at an interface between the first nucleation layer and the second nucleation layer is greater than zero but less than 0.1% atomic, and wherein a fluorine concentration of the second nucleation layer is in a range of 4% atomic and 6% atomic; and
    a first metal-comprising material over the second nucleation layer, wherein the first metal-comprising material extends continuously from a first sidewall of the second nucleation layer to a second sidewall of the second nucleation layer, the second sidewall of the second nucleation layer faces the first sidewall of the second nucleation layer.

11. The semiconductor device of claim 10, wherein the gate stack further comprises:
    a second metal-comprising material; and
    a third metal-comprising material over the second metal-comprising material, the second metal-comprising material having a different material composition than the first metal-comprising material, the second metal-comprising material and the third metal-comprising material are between the high-k dielectric and the first nucleation layer.

12. The semiconductor device of claim 11, wherein the third metal-comprising material covers a topmost surface of the second metal-comprising material.

13. The semiconductor device of claim 11 further comprising a barrier layer between the second nucleation layer and the third metal-comprising material.

14. The semiconductor device of claim 10, wherein the first nucleation layer is free of fluorine and wherein the second nucleation layer comprises fluorine.

15. The semiconductor device of claim 10 further comprising:
    gate spacers on sidewalls of the gate stack, wherein the gate spacers extend higher than the gate stack; and
    a capping layer over the gate stack, the capping layer is disposed between the gate spacers.

16. A transistor comprising:
    a first source/drain region;
    a second source/drain region; and a gate between the first source/drain region and the second source/drain region, the gate comprising:
a gate dielectric;
a first work function metal layer over the gate dielectric;
a second work function metal layer over the first work function metal layer;
a barrier layer over the second work function metal layer;
a first tungsten-comprising layer over the barrier layer;
a second tungsten-comprising layer over the first tungsten-comprising layer, an oxygen concentration at an interface between the first tungsten-comprising layer and the second tungsten-comprising layer is greater than zero but less than 0.1% atomic, and wherein a fluorine concentration of the second tungsten-comprising layer is in a range of 4% atomic and 6% atomic; and
a metal layer over the second tungsten-comprising layer, wherein the metal layer is free of gaps filled with vacuum or air.

17. The transistor of claim 16, wherein the first tungsten-comprising layer has a lower fluorine concentration than the second tungsten-comprising layer.

18. The transistor of claim 16, wherein the metal layer is a tungsten layer.

\* \* \* \* \*